(12) United States Patent
Lin

(10) Patent No.: US 6,184,152 B1
(45) Date of Patent: Feb. 6, 2001

(54) METHOD FOR FABRICATING STACKED CAPACITOR FOR A DYNAMIC RANDOM ACCESS MEMORY

(75) Inventor: Chenyong Frank Lin, San Jose, CA (US)

(73) Assignee: Integrated Silicon Solution Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/013,752

(22) Filed: Jan. 27, 1998

(51) Int. Cl.⁷ .............................................. H01L 21/8242
(52) U.S. Cl. ........................................... 438/753; 438/254
(58) Field of Search .................................... 438/238–240, 438/250–256, 381, 393–399, 3

(56) References Cited

U.S. PATENT DOCUMENTS

| | | |
|---|---|---|
| 5,192,702 | 3/1993 | Tseng . |
| 5,381,365 | 1/1995 | Ajika, et al. . |
| 5,451,537 * | 9/1995 | Tseng et al. . |
| 5,591,664 | 1/1997 | Wang, et al. . |
| 5,595,929 | 1/1997 | Tseng . |
| 5,652,164 | 7/1997 | Dennison, et al. . |
| 5,661,063 | 8/1997 | Lee . |
| 5,665,624 | 9/1997 | Hong . |
| 5,670,404 | 9/1997 | Dai . |
| 5,672,533 | 9/1997 | Arima, et al. . |
| 5,677,220 | 10/1997 | Shono, et al. . |
| 5,677,227 | 10/1997 | Yang, et al. . |
| 5,677,867 | 10/1997 | Hazani . |
| 5,679,595 | 10/1997 | Chen . |
| 5,679,598 | 10/1997 | Yee . |
| 5,733,808 * | 3/1998 | Tsensg ................................. 438/239 |
| 5,849,619 * | 12/1998 | Cho et al. ............................ 438/238 |
| 5,851,877 * | 12/1998 | Ho et al. .............................. 438/253 |
| 5,940,701 * | 8/1999 | Tseng .................................. 438/253 |
| 5,989,952 * | 11/1999 | Jen et al. ............................. 438/253 |

* cited by examiner

Primary Examiner—Jey Tsai
(74) Attorney, Agent, or Firm—Pennie & Edmonds LLP

(57) ABSTRACT

A method is provided for fabricating an array of memory cells for a dynamic random access memory. Each memory cell has an associated capacitor. An array of memory cell transistors is formed and each memory cell transistor has a source, a drain and a gate. The source is coupled to a bit line, and the gate is coupled to a word line. A lower conductive layer is formed over the array of memory cell transistors. The lower conductive layer is electrically coupled to the source of the memory cell transistors. A temporary insulation layer is formed over the lower conductive layer. A portion of the temporary insulation layer and the lower conductive layer are removed to form an electrically separate capacitor bottom plate for each memory cell and an inter-capacitor isolation region. A lateral portion of the temporary insulation layer is removed to form a capacitor sidewall spacing region. A protective layer is formed to fill the inter-capacitor isolation region and the capacitor sidewall spacing region. The temporary insulation layer is removed to expose a portion of the lower conductive layer. A portion of the exposed portion of the lower conductive layer is removed to form a U-shaped capacitor bottom plate. The protective layer is removed and a capacitor dielectric is formed. An upper conductive layer is formed to function as a top plate of the capacitor.

33 Claims, 5 Drawing Sheets

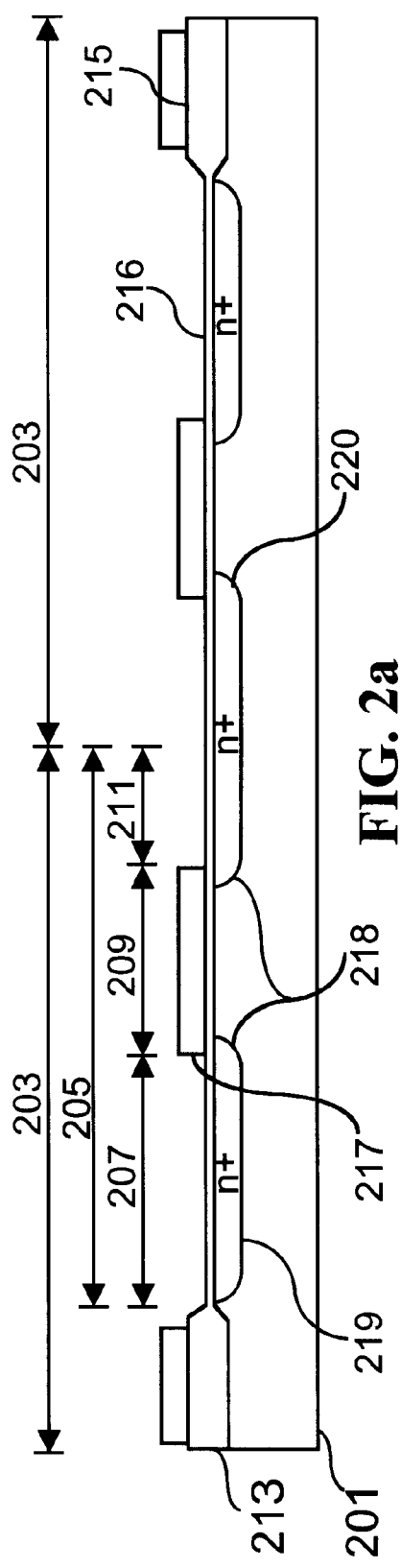
FIG. 2a
FIG. 2b

METHOD FOR FABRICATING STACKED CAPACITOR FOR A DYNAMIC RANDOM ACCESS MEMORY

The present invention relates generally to a dynamic random access memory (DRAM), and particularly to a self-aligned stacked capacitor for an array of memory cells for a DRAM.

BACKGROUND OF THE INVENTION

A DRAM is a semiconductor device for storing digital information. Data, as digital information, can be written to and read from a DRAM. DRAMS are fabricated using integrated circuit technology.

A DRAM is made of many storage nodes or memory cells and each memory cell has a memory cell transistor and a capacitor. The capacitor is an important element of the memory cell because it stores the digital information. Trench capacitors and stack capacitors are the two major types of DRAM cell capacitors.

The higher the capacitance of the capacitor the better. Higher capacitance improves the data sensing margin and increases the shrinkability of the memory cell. One way to increase capacitance is to increase the surface area of the capacitor (capacitor area). The trench capacitor increases the capacitor area by digging a deep trench inside the bulk silicon. The stack capacitor increases the capacitor area by raising the height of the capacitor above the surface of the silicon wafer. One particular type of stack capacitor has a cylindrical shape to increase the capacitor area without increasing the area and height of the memory cell. Stack capacitors are also referred to as capacitor-over-bit-line (COB) capacitors.

DRAM density is ever-increasing and the size of memory cell area on the DRAM chip is decreasing. Each memory cell capacitor uses a large amount of space on the DRAM. The need for memory cell capacitors to be isolated from each other also uses space. To increase DRAM density, a method is needed to further increase the size of the DRAM memory cell capacitor and to decrease the spacing between memory cell capacitors.

SUMMARY OF THE INVENTION

A method is provided for fabricating an array of memory cells for a dynamic random access memory. Each memory cell has an associated capacitor. An array of memory cell transistors is formed and each memory cell transistor has a source, drain and gate. The drain is coupled to a bit line, and the gate is coupled to a word line. A lower conductive layer is formed over the array of memory cell transistors. The lower conductive layer is electrically coupled to the source of the memory cell transistors. An temporary insulation layer is formed over the lower conductive layer. A portion of the temporary insulation layer and the lower conductive layer are removed to form an electrically separate capacitor bottom plate for each memory cell and an inter-capacitor isolation region. A lateral portion of the temporary insulation layer is removed to form a capacitor sidewall spacing region. A protective layer is formed to fill the inter-capacitor isolation region and the capacitor sidewall spacing region. The temporary insulation layer is removed to expose a portion of the lower conductive layer. A portion of the exposed portion of the lower conductive layer is removed to form a U-shaped capacitor bottom plate. The protective layer is removed and a capacitor dielectric is formed. An upper conductive layer is formed to function as a top plate of the capacitor.

BRIEF DESCRIPTION OF THE DRAWINGS

FIG. 2a shows the formation of the memory cell transistor and the word lines.

FIG. 2b shows the formation of the bit line.

DESCRIPTION OF THE PREFERRED EMBODIMENTS

Figure 1:
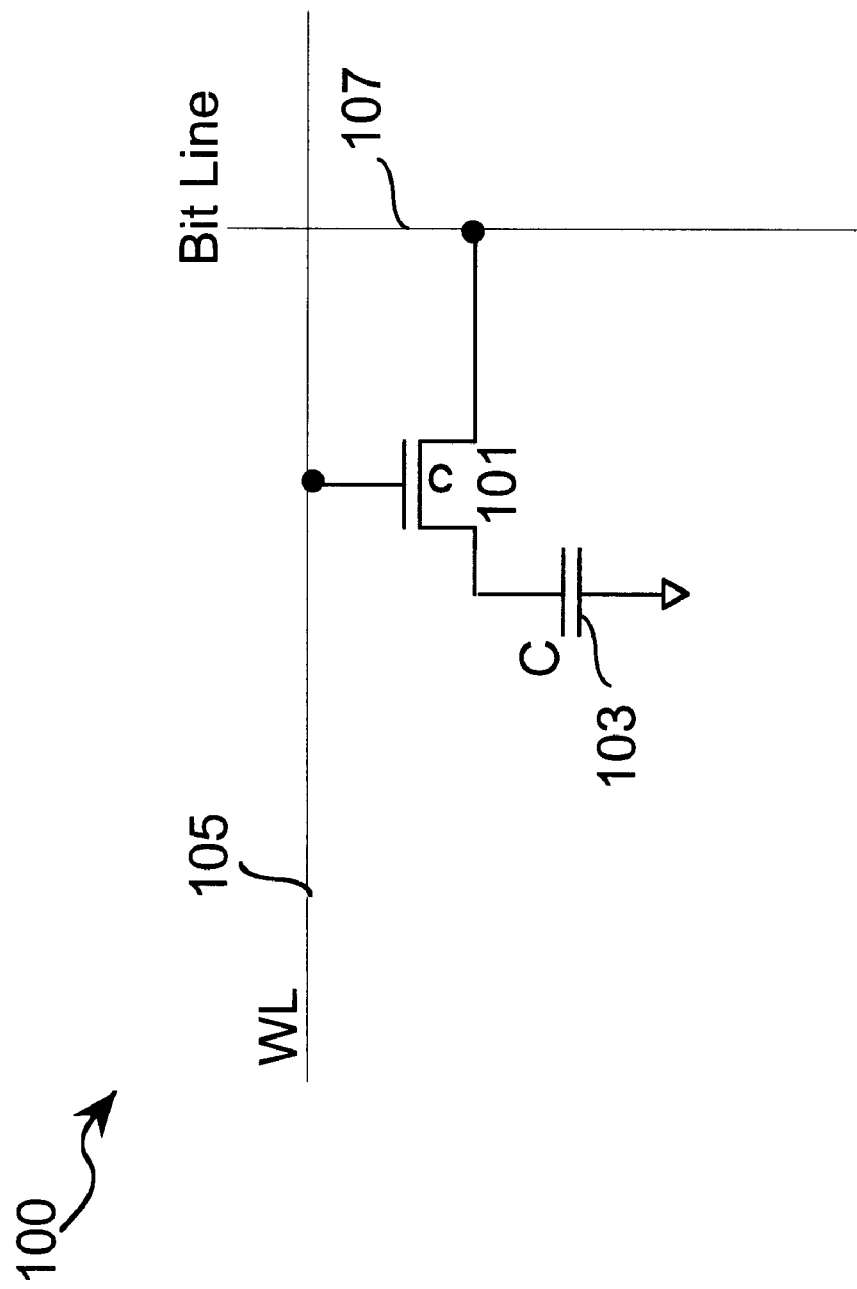
FIG. 1 is a schematic diagram of a DRAM memory cell using the stacked capacitor fabricated by the method of the present invention.

FIG. 1 is a schematic diagram of a DRAM memory cell 100 using the stacked capacitor fabricated by the method of the present invention. A DRAM has many memory cells 100. Typically, each memory cell 100 comprises a combination of a memory cell transistor 101 and a capacitor C 103. In the memory cell 100, digital information is represented by a charge stored in the capacitor C 103. When a memory cell 100 stores a one value, the capacitor 103 is charged, and when the memory cell 100 stores a zero value, the capacitor 103 is discharged. However, the present invention is equally applicable when a charged capacitor 103 is used to store a zero value and a discharged capacitor 103 is used to store a one value.

The capacitor 103 will lose any stored charge unless it is regularly recharged or refreshed. Also, reading the information stored in the memory cell 100 destroys the contents of the memory cell 100. More specifically, after a memory cell 100 that previously had a charged capacitor 103 has been read, the amount of charge remaining on the capacitor 103 is not sufficient to distinguish it from a memory cell 100 having a discharged capacitor 103. As a result, the information previously stored in the memory cell 100 needs to be restored after it has been read. Also, the memory cell 100 needs to be periodically refreshed to prevent the information stored by the memory cell 100 from being lost due to charge leakage.

Each memory cell 100 is connected to a word line (WL) 105 and a bit line 107. A word-line driver restores the contents of the memory cell 100. To restore a "one" level to the memory cell capacitor C 103, the word line driver must output a voltage on the word line 105 that exceeds the voltage present on the bit line 107. Since the maximum voltage that will be present on the bit line 107 after a read operation is the supply voltage Vcc, the word line driver must generate a voltage that exceeds Vcc. Typically, the word line driver is a charge pump circuit that generates a voltage that exceeds the supply voltage Vcc.

The capacitor 103 has two plates separated by a dielectric. One plate of the capacitor 103 is connected to the drain of the memory cell transistor 101. The other plate of the capacitor 103 is connected to ground. The word line 105 is connected to the gate of the memory cell transistor 101. The bit line 107 is connected to the source of the memory cell transistor 101. Alternatively, the drain of the memory cell transistor 101 can be connected to the bit line 107 and the source of the memory cell transistor 101 can be connected to the capacitor 103.

Figure 2C:
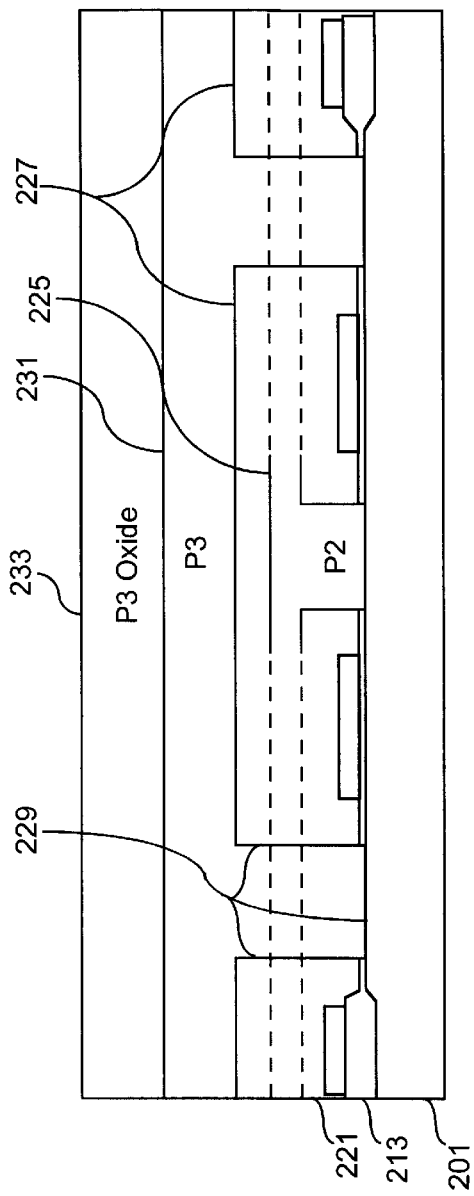
FIG. 2c shows the formation of the capacitor contact with the memory cell transistor.

FIGS. 2a–2h show a method to build a memory cell for a DRAM using the self-aligned cylinder opening of the present invention. FIGS. 2a and 2b show well-known steps to form the memory cell transistor 101, the word line 1 05 and the bit line 107 in a stacked capacitor structure.

FIG. 2a shows the formation of the memory cell transistor and the word lines 105. A substrate 201 has two memory cell regions 203 and each memory cell region 203 contains a memory cell. The substrate 201 can be silicon. The memory cell region 203 has a memory cell transistor area 205 including a source area 207, a gate area 209 and a drain area 211. In an alternative embodiment, the source and drain areas can be reversed.

An interlayer dielectric (ILD) 213 is adjacent the substrate 201. The ILD 213 is partially shown to simplify the description and is well-known. First, field oxide is formed in inactive regions. Selected portions of the substrate 201 are masked against oxidation and the exposed unmasked surface is oxidized. The exposed unmasked areas remain as high areas 215 making up a field-oxide-pattern (FOX). The high areas 215 form dielectric isolation regions for isolating semiconductor surface regions from other such regions in the substrate 201. Next, the surface of the substrate 201 is thermally oxidized to form the oxide layer to a desired thickness in the unmasked areas of the substrate 201. As a result, the high areas 215 are surrounded by low areas having a reduced oxide thickness 216.

The word line 105 comprises a first conductive layer 217 such as a polysilicon layer or a combination of polysilicon and metal silicide layers. The metal silicide layer can be tungsten silicide ($WSi_2$) or cobalt silicide ($CoSi_2$). The polysilicon layer can be doped to provide conductivity. The word lines 105 are patterned using conventional lithography and anisotropic etching techniques. Alternatively, the word lines 105 can be formed using a composite layer. To form the composite layer, a layer of polysilicon is deposited by a LPCVD process, then a metal silicide layer is deposited on top of the polysilicon layer using a LPCVD process. The metal silicide layer reduces the sheet resistance of the polysilicon layer. The word lines 105 of the DRAM connect the gates of the memory cell transistors in a desired pattern.

The formation of memory cell transistors 101 is well-known. A lithographic mask exposes the source and drain areas, 207 and 211 respectively, and the exposed areas of the substrate 201 are doped with ions 218 to form a source 219 and a drain 220. N-type ions are implanted to produce an n-channel transistor, and P-type ions are implanted to produce a p-channel transistor. Typically, the memory cell 100 comprises an n-channel transistor.

For simplicity, the source and drain components of the memory cell transistor will not be shown in subsequent drawings although they are present.

FIG. 2b shows the formation of the bit line 107. A first insulation layer 221 is formed over the surface adjacent the word lines. The first insulation layer 221 comprises oxide, such as $SiO_2$ The first insulation layer 221 can be patterned using conventional lithographic and etching techniques to form a bit-line opening 223 in the first insulation layer 221 for the bit line to contact the drain area 211.

The bit line is then formed by depositing a second conductive layer 225, such as a second polysilicon layer (P2) or a combination of polysilicon and metal silicide layers, over the first insulation layer 221. The metal silicide layer can be tungsten silicide ($WSi_2$) or cobalt silicide ($CoSi_2$). The second polysilicon layer can be doped. The second conductive layer 225 fills the bit-line opening 223 in the insulation layer 221 and electrically contacts the drain area 211. The deposition process can form the bit-line using doped polysilicon deposited by a low pressure chemical vapor deposition (LPCVD) process. Alternatively, the bit-line can be formed using a composite layer. To form the composite layer, a layer of polysilicon is deposited by a LPCVD process, then a metal silicide layer is deposited on top of the polysilicon layer using a LPCVD process. The metal silicide layer reduces the sheet resistance of the polysilicon layer.

The dotted lines in FIG. 2b show that the bit line extends across the DRAM. In FIG. 2b and subsequent figures, the bit line is behind, and does not contact, the area in which the capacitor will be formed.

FIG. 2c shows the formation of the capacitor contact where the bottom plate of the capacitor 103 contacts the source 219 of the memory cell transistor 101 in a portion of the source region 207. A second insulation layer 227 is formed over the bit lines 225. The second insulation layer 227 comprises oxide, such as $SiO_2$, or a composite layer of $SiO_2$ and spin-on-glass (SOG) and is deposited using well-known deposition techniques such as LPCVD The second insulation layer 227 is planarized (providing a flat surface) using a chemical-mechanical polish (CMP) process. Alternatively, a plasma etch back process can be used to planarize the composite layer of $SiO_2$ and SOG.

A capacitor opening 229 is formed over a portion of the source region 207 and extends to the substrate 201 so that the bottom plate of the capacitor 103 will contact a portion of the transistor's source 219 in the source area 207 of the memory cell transistor 100. The bottom plate 231 of the capacitor 103 is formed. A third conductive layer 231, such as a third polysilicon layer (P3) is deposited and fills the storage node opening 229. The third polysilicon layer can be doped. A LPCVD process can be used to deposit the third polysilicon layer.

The desired amount of capacitance (capacitance value) is a function of the height and thickness of the capacitor sidewalls. The thickness of the third conductive layer 231 defines the height of the capacitor sidewalls. Preferably, the capacitor sidewalls have a height of about 4,000 angstroms (Å). The height of the capacitor sidewall is determined by the cell area. A smaller cell area implies a smaller capacitor area. To compensate for a smaller cell area, a higher capacitor sidewall is used to provide sufficient capacitance (about 30 femto-farads per cell). The thickness of the capacitor sidewalls will be discussed below.

A third insulation layer 233 is deposited over the third conductive layer 231. The third insulation layer 233 can be an oxide such as $SiO_2$, and can be formed using well-known deposition techniques.

Figure 2D:
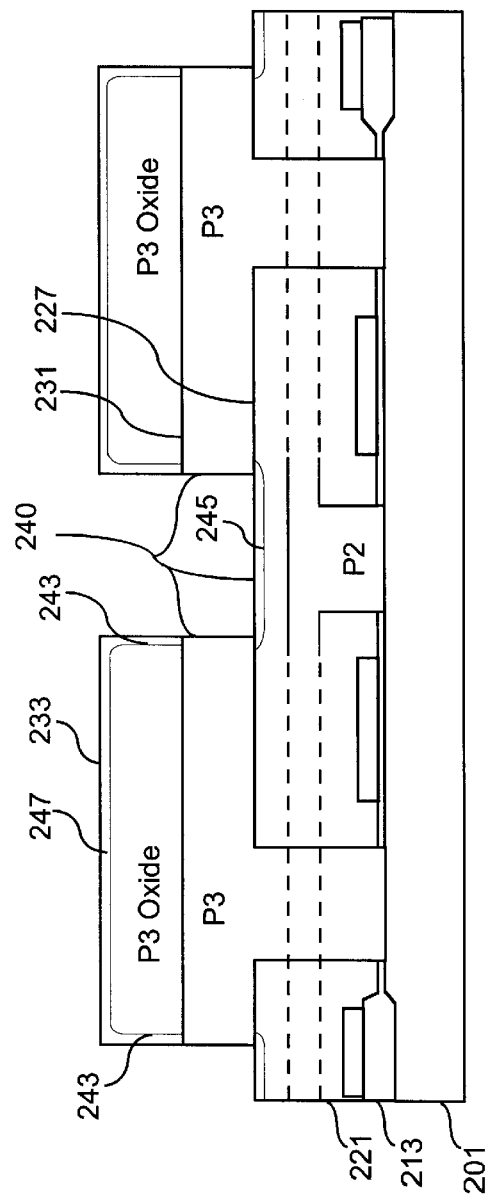
FIG. 2d shows the formation of the sidewalls of the capacitor and an inter-capacitor isolation region.

FIG. 2d shows the formation of the sidewalls of the capacitor and an inter-capacitor isolation region 240. The inter-capacitor isolation region 240 separates the capacitors 103 in adjacent memory cells 100 and is formed by anisotropically etching the third insulation layer 233 and third conductive layer 231 in a predetermined pattern. The inter-capacitor isolation region 240 extends to the second insulation layer 227.

Next, a capacitor sidewall spacing region 243 is formed by laterally etching the third insulation layer 233. An isotropic etch, such as a wet-etch process, is used. Both the top 247 and sides 243 of the third insulation layer 233 are etched. The wet-etch process also etches a portion of the second insulation layer 245 and undercuts the edges of the third conductive layer 231. Because the wet-etch process is a selective chemical etch, the third conductive layer 231 is not etched.

The wet-etch process defines the thickness of the capacitor sidewalls. In a preferred embodiment, the capacitor sidewalls are about 500 Å thick with a deviation of ±100 Å. The etch rate can be controlled and a desired etch rate can be selected. In a preferred embodiment, the etch rate is about ten to fifteen angstroms per second. If the wet-etch process takes about thirty seconds and at an etch rate of fifteen Å per second, the capacitor sidewall spacing region 243 will be about 450 Å.

Figure 2E:
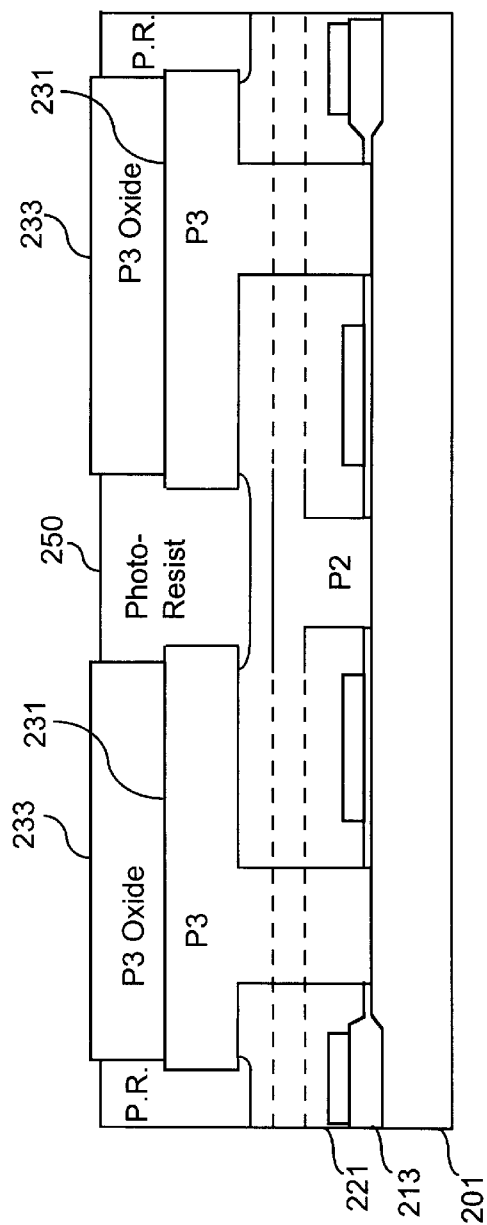
FIG. 2e shows the formation of the capacitor cylinder opening mask.

FIG. 2e shows the formation of the capacitor cylinder opening mask. After laterally etching the third insulation layer 233, a protective layer 250 such as photo-resist is applied to or spun onto the surface. The protective layer 250 fills the inter-capacitor isolation region 240 and capacitor sidewall spacing region 243. Then, as shown in FIG. 2e, a portion of the protective layer 250 is removed or etched back to expose a portion of the third insulation layer 233.

Figure 2F:
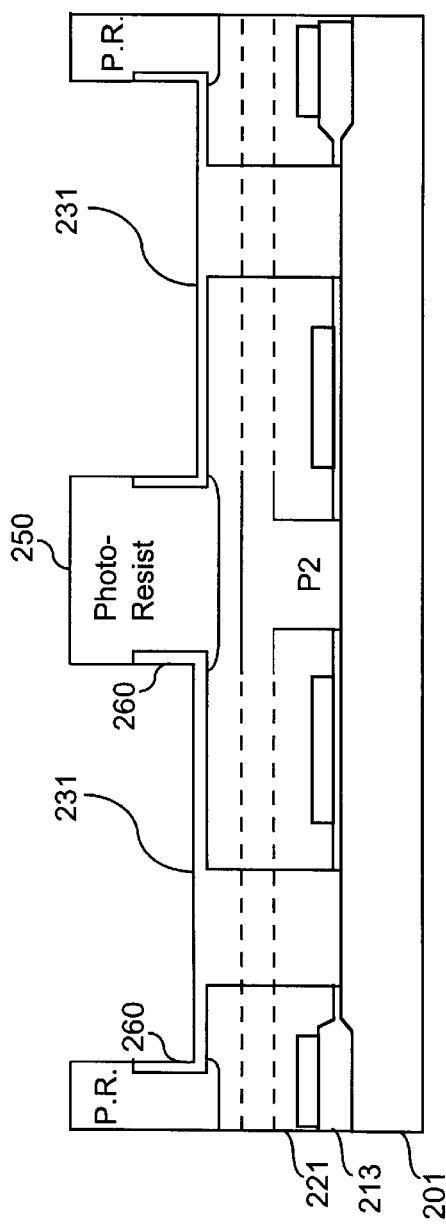
FIG. 2f shows the formation of the interior surface of the capacitor bottom plate.

FIG. 2f shows the formation of the interior surface of the capacitor 103 bottom plate. Another wet-etch process completely removes the third insulation layer 233. An anisotropic etch of the third conductive layer 231 removes a portion of the third conductive layer 231. The portion of the third conductive layer 231 beneath the photo-resist layer 250 remains to form the sidewalls 260 of the bottom plate of the capacitor 103.

Figure 2G:
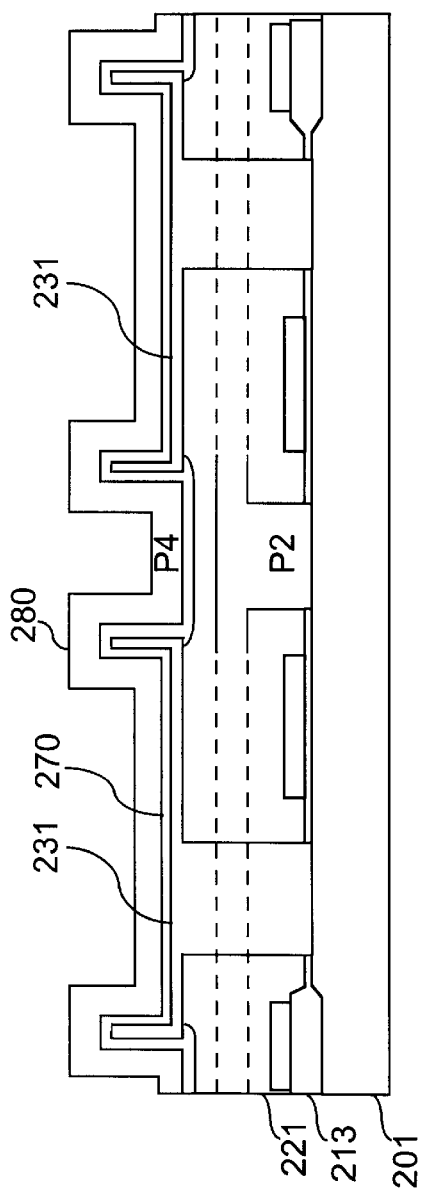
FIG. 2g shows the formation of the capacitor dielectric and capacitor top plate.

FIG. 2g shows the formation of the capacitor dielectric and capacitor top plate. The protective layer 250 is removed by etching or plasma ashing. As a result, the third conductive layer 231, which functions as the bottom plate of the capacitor, is exposed. A dielectric layer 270 is formed on the surface of the third conductive layer 231. The dielectric layer 270 can be an oxide, silicon nitride or $Ta_2O_5$ layer. Alternatively, the dielectric layer 270 is a composite layer such as oxide-nitride-oxide (ONO) in which the oxide layers are thermally grown. For higher capacitance, $Ta_2O_5$ is used.

After forming the dielectric layer 270, a fourth conductive layer 280 is formed adjacent the dielectric layer 270 to function as the top plate of the capacitor. The fourth conductive layer 280 is common to all the capacitors. The fourth conductive layer 280 can be made of doped polysilicon and can be deposited using a LPCVD process. The doped polysilicon layer is about 1,000 Å thick.

Figure 2H:
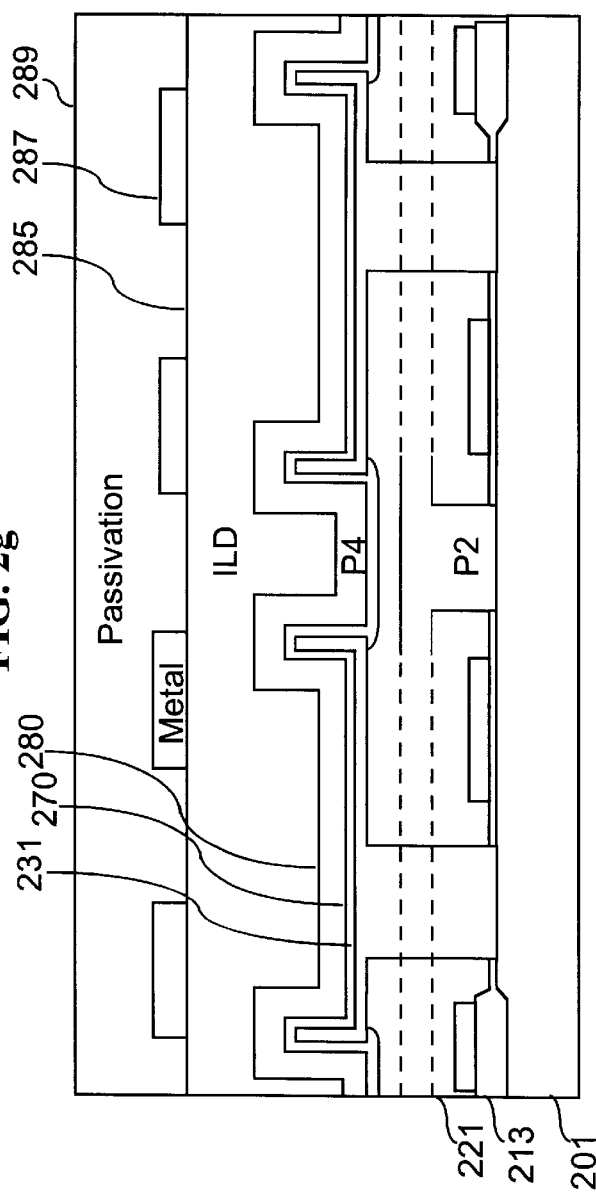
FIG. 2h shows the formation of the inter-layer dielectric, metalization and passivation layers.

FIG. 2h shows the formation of a fourth insulation layer 285 or inter-layer dielectric layer (ILD), a metalization layer 287 and a passivation layer 289 to complete the manufacturing process for the memory cell of the DRAM.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for fabricating an array of memory cells for a dynamic random access memory, each memory cell having an associated capacitor, comprising the steps of:

forming an array of memory cell transistors, one for each memory cell, each having a source, a drain coupled to a bit line, and a gate coupled to a word line;

forming a lower conductive layer over the array of memory cell transistors, the lower conductive layer being electrically coupled to the source of the memory cell transistors;

forming a temporary insulation layer over the lower conductive layer;

removing a portion of the temporary insulation layer and the lower conductive layer to form an electrically separate capacitor bottom plate for each memory cell and an inter-capacitor isolation region;

removing a lateral portion of the temporary insulation layer to form a capacitor sidewall spacing region;

forming a protective layer, the protective layer filling the inter-capacitor isolation region and the capacitor sidewall spacing region;

removing the temporary insulation layer to expose a portion of the lower conductive layer;

removing a portion of the exposed portion of the lower conductive layer to form the bottom plate in a U-shape;

removing the protective layer;

forming a capacitor dielectric adjacent the lower conductive layer; and forming an upper conductive layer adjacent the capacitor dielectric so as to form a top plate of the capacitor associated with each memory cell.

2. The method of claim 1 wherein the step of removing a lateral portion of the temporary insulation layer comprises an isotropic etch process.

3. The method of claim 2 wherein the isotropic etch process is a wet-etch process.

4. The method of claim 1 wherein the step of removing a portion of the temporary insulation layer and the lower conductive layer comprises an anisotropic etch process.

5. The method of claim 1 wherein the lower conductive layer and the upper conductive layer comprise polysilicon.

6. The method of claim 1 wherein the protective layer comprises photoresist.

7. The method of claim 1 further comprising the steps of:

forming a memory cell insulation layer over the array of memory cell transistors before depositing the lower conductive layer, and wherein the step of removing a portion of the temporary insulation layer and the lower conductive layer to form the bottom plate removes the lower conductive layer until the memory cell insulation layer is reached.

8. A method for fabricating a memory cell for a dynamic random access memory, the memory cell having a capacitor, comprising the steps of:

forming a memory cell transistor area on a substrate, the memory cell transistor area having a source area, a gate area and a drain area;

forming a memory cell transistor in the memory cell transistor area, the memory cell transistor having a source in the source area, a gate in the gate area and a drain in the drain area;

forming a first conductive layer in the gate area to form a word line;

forming a first insulation layer over the formed memory cell transistor and first conductive layer;

removing a portion of the first insulation layer adjacent the memory cell transistor area to reach the drain area to form a bit-line opening;

forming a second conductive layer, the second conductive layer filling the bit-line opening to electrically connect the drain area and to form a bit line;

forming a second insulation layer over the second conductive layer;

removing a portion of the second insulation layer over the source area to form a capacitor opening reaching the source area of the memory cell transistor;

forming a third conductive layer, the third conductive layer filling the capacitor opening and electrically connecting the source of the memory cell transistor;

forming a third insulation layer adjacent the third conductive layer;

removing a portion of the third insulation layer and the third conductive layer to form an inter-capacitor isolation region reaching the second insulation layer;

removing a lateral portion of the third insulation layer to form a capacitor sidewall spacing region;

forming a protective layer, the protective layer filling the inter-capacitor isolation region and the capacitor sidewall spacing region;

removing the third insulation layer to expose a portion of the third conductive layer;

removing a portion of the third conductive layer to form a U-shaped capacitor bottom plate;

removing the protective layer;

forming a capacitor dielectric adjacent the third conductive layer; and forming a fourth conductive layer adjacent the capacitor dielectric so as to form a top plate of the capacitor associated with each memory cell.

9. The method of claim 8 wherein the step of removing a lateral portion of the third insulation layer comprises an isotropic etch process.

10. The method of claim 9 wherein the isotropic etch process is a wet-etch process.

11. The method of claim 8 wherein the step of removing a portion of the third insulation layer and the third conductive layer comprises an anisotropic etch process.

12. The method of claim 8 wherein the third conductive layer and the fourth conductive layer comprise polysilicon.

13. The method of claim 8 wherein the protective layer comprises photoresist.

14. A method for fabricating a capacitor, comprising:

forming a lower conductive layer;

forming an insulation layer;

removing aportion of the insulation layer and the lower conductive layer to form a capacitor bottom plate and an intercapacitor isolation region adjacent the capacitor bottom plate;

removing a lateral portion of the insulation layer to form a capacitor sidewall spacing region;

forming a protective layer over the capacitor sidewall spacing region, the protective layer filling the inter-capacitor isolation region;

removing the insulation layer to expose a portion of the lower conductive layer;

removing a portion of the exposed portion of the lower conductive layer to shape the capacitor bottom plate;

removing the protective layer;

forming a capacitor dielectric adjacent the lower conductive layer; and forming an upper conductive layer adjacent the capacitor dielectric so as to form a top plate of the capacitor.

15. The method of claim 14 further comprising:

forming an array of memory cell transistors, one for each memory cell, each having a source, a drain coupled to a bit line, and a gate coupled to a word line;

wherein said forming forms the lower conductive layer over the array of memory cell transistors, the lower conductive layer being electrically coupled to the source of the memory cell transistors.

16. The method of claim 15 further comprising:

forming a memory cell insulation layer over the array of memory cell transistors before forming the lower conductive layer, and wherein said removing a portion of the insulation layer and the lower conductive layer to form the capacitor bottom plate removes the lower conductive layer until the memory cell insulation layer is reached.

17. The method of claim 14 wherein said removing a lateral portion of the insulation layer comprises an isotropic etch process.

18. The method of claim 17 wherein the isotropic etch process is a wet-etch process.

19. The method of claim 14 wherein said removing a portion of the insulation layer and the lower conductive layer comprises an anisotropic etch process.

20. The method of claim 14 wherein the lower conductive layer and the upper conductive layer comprise polysilicon.

21. The method of claim 14 wherein the protective layer comprises photo-resist.

22. A method for fabricating a memory cell for a dynamic random access memory, the memory cell having a capacitor, comprising:

forming a memory cell transistor area on a substrate, the memory cell transistor area the memory cell transistor having a source in the source area, a gate in the gate area and a drain in the drain area;

forming a memory cell transistor in the memory cell transistor area, the memory transistor having a source in the source area, a gate in the gate area and a drain in the drain area;

forming a first conductive layer in the gate area to form a word line;

forming a first insulation layer over the formed memory cell transistor and first conductive layer;

removing a portion of the first insulation layer adjacent the memory cell transistor area to reach the drain area to form a bit-line opening;

forming a second conductive layer, the second conductive layer filling the bit-line opening to electrically connect the drain area and to form a bit line;

forming a second insulation layer over the second conductive layer;

removing a portion of the second insulation layer over the source area to form a capacitor opening reaching the source area of the memory cell transistor;

forming a third conductive layer, the third conductive layer filling the capacitor opening and electrically connecting the source of the memory cell transistor;

forming a third insulation layer adjacent the third conductive layer;

removing a portion of the third insulation and the third conductive layer to form an inter-capacitor isolation region reaching the second insulation layer;

removing a lateral portion of the third insulation layer to form a capacitor sidewall spacing region;

forming a protective layer, the protective layer filling the inter-capacitor isolation region and the capacitor sidewall spacing region;

removing the third insulation layer to expose a portion of the third conductive layer;

removing a portion of the third conductive layer to form a capacitor bottom plate;

removing the protective layer;

forming a capacitor dielectric adjacent the third conductive layer; and forming a fourth conductive layer adjacent the capacitor dielectric so as to form a top plate of the capacitor associated with each memory cell.

23. The method of claim 22 wherein said removing a lateral portion of the third insulation layer comprises an isotropic etch process.

24. The method of claim 23 wherein the isotropic etch process is wet-etch process.

25. The method of claim 22 wherein said removing a portion of the third insulation layer and the third conductive layer comprises an anisotropic etch process.

26. The method of claim 22 wherein the third conductive layer and the fourth conductive layer comprise polysilicon.

27. The method of claim 22 wherein the protective layer comprises photo-resist.

28. A method for fabricating a capacitor, comprising:

forming a lower conductive layer;

removing a portion of the lower conductive layer to form an inter-capacitor isolation region;

forming a capacitor sidewall spacing region over the lower conductive layer;

forming a protective layer over the capacitor sidewall spacing region, the protective layer filling the inter-capacitor isolation region;

shaping the lower conductive dielectric adjacent the lower conductive layer; and forming an upper conductive layer adjacent the capacitor dielectric so as to form a top plate of the capacitor.

29. The method of claim 28 further comprising:

removing the protective layer.

30. The method of claim 28 wherein said shaping comprises removing a portion of lower conductive layer.

31. The method of claim 28 wherein said forming the capacitor sidewall spacing region over the lower conductive layer includes forming an insulation layer adjacent at least a portion of the lower conductive layer, and removing a portion of the insulation layer.

32. The method of claim 31 wherein said removing the portion of the insulation layer comprises an isotropic etch process.

33. The method of claim 32 wherein said isotropic etch process is a wet-etch process.

* * * * *